United States Patent

Westwater et al.

[11] Patent Number: 6,130,143
[45] Date of Patent: Oct. 10, 2000

[54] QUANTUM WIRES FORMED ON A SUBSTRATE, MANUFACTURING METHOD THEREOF, AND DEVICE HAVING QUANTUM WIRES ON A SUBSTRATE

[75] Inventors: Jonathan Westwater; Dharam Pal Gosain; Miyako Nakagoe; Setsuo Usui, all of Kanagawa, Japan

[73] Assignee: Sony Corporation, Tokyo, Japan

[21] Appl. No.: 09/376,908

[22] Filed: Aug. 18, 1999

Related U.S. Application Data

[62] Division of application No. 08/956,081, Oct. 24, 1997, Pat. No. 5,976,957.

[30] Foreign Application Priority Data

| Oct. 28, 1996 | [JP] | Japan | P08-302512 |
| Dec. 5, 1996 | [JP] | Japan | P08-325555 |
| Mar. 21, 1997 | [JP] | Japan | P09-068484 |
| Sep. 4, 1997 | [JP] | Japan | P09-256045 |

[51] Int. Cl.$^7$ ................................................. H01L 21/20
[52] U.S. Cl. ................................. 438/478; 438/962
[58] Field of Search ........................... 438/503, 478, 438/489, 686, 22, 28, 641, 675, 962, 507

[56] References Cited

U.S. PATENT DOCUMENTS

| 5,244,828 | 9/1993 | Okada et al. ........................... 438/479 |
| 5,296,719 | 3/1994 | Hirai et al. ............................. 257/14 |
| 5,313,486 | 5/1994 | Arimoto et al. ........................ 372/46 |
| 5,381,753 | 1/1995 | Okatama et al. ....................... 417/935 |
| 5,405,454 | 4/1995 | Hirai et al. ............................. 438/407 |
| 5,427,648 | 6/1995 | Pamulapati et al. ................... 216/24 |
| 5,567,954 | 10/1996 | Dobson et al. ........................ 257/3 |
| 5,583,351 | 12/1996 | Brown et al. .......................... 257/89 |
| 5,607,876 | 3/1997 | Biengelsen et al. ................... 438/478 |
| 5,612,255 | 3/1997 | Chpple-Sokol et al. ............... 438/197 |
| 5,630,905 | 5/1997 | Lynch et al. ........................... 438/507 |
| 5,643,828 | 7/1997 | Ugajin et al. .......................... 438/962 |
| 5,710,430 | 1/1998 | Tanamoto et al. ..................... 257/14 |
| 5,739,057 | 4/1998 | Tiwari et al. .......................... 438/172 |
| 5,858,862 | 1/1999 | Westwater et al. .................... 438/503 |

OTHER PUBLICATIONS

Liu et al "Study of Dry Oxidation of Tringle–Shaped Silicon Nanostructure" Appl. Phys. Lett 69(12), pp. 1761–1763, Sep. 16, 1996.

Lau et al "High Aspect Rato Submicron Silicon Fillers Fabricated by Photoresisted Electrochemical Etching and Oxidation" Appl. Phys. Lett. vol. 67(13), pp. 1877–1879, Sep. 25, 1995.

*Primary Examiner*—Savitri Mulpuri
*Attorney, Agent, or Firm*—Hill & Simpson

[57] ABSTRACT

While a silicon substrate is heated, gold is evaporated thereon at a thickness of 0.6 nm, whereby melted alloy droplets are formed on the substrate surface. Then, the silicon substrate is heated to 450°–650° C. in a silane gas atmosphere of less than 0.5 Torr. As a result, a silane gas decomposition reaction occurs with the melted alloy droplets serving as catalysts, whereby silicon wires grow on the substrate surface. Subsequently, the metal alloy droplets at the tips of the silicon wires are removed and surface portions of the silicon wires are oxidized. Resulting surface oxide films are thereafter removed. As a result, silicon quantum wires that are thinner by the thickness of the surface oxide films are obtained.

4 Claims, 14 Drawing Sheets

|←—→|
50nm

FIG. 11
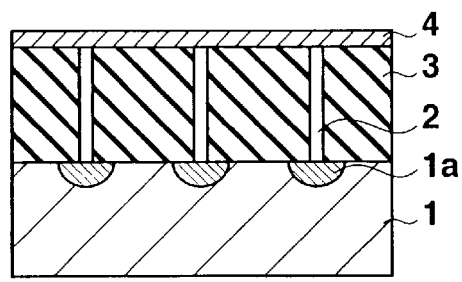
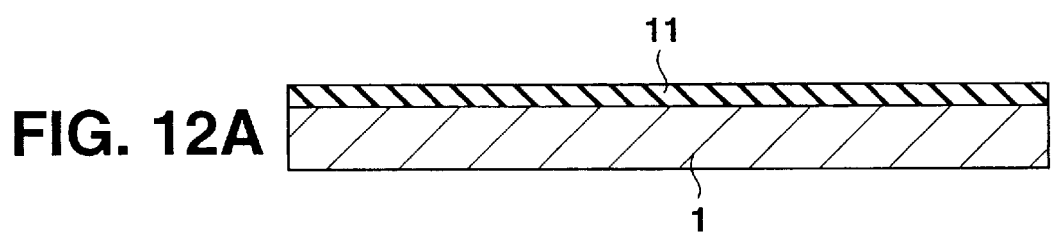
FIG. 12A
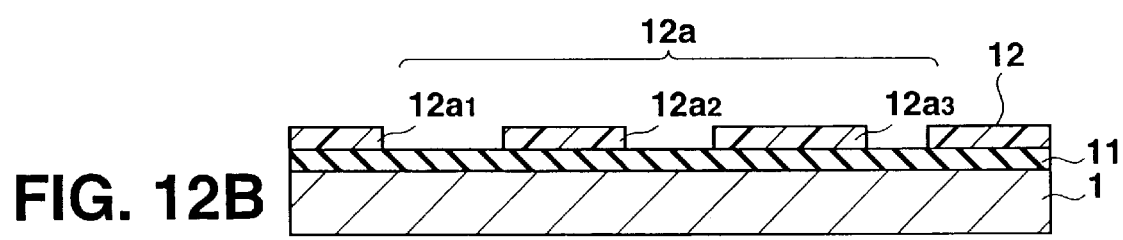
FIG. 12B
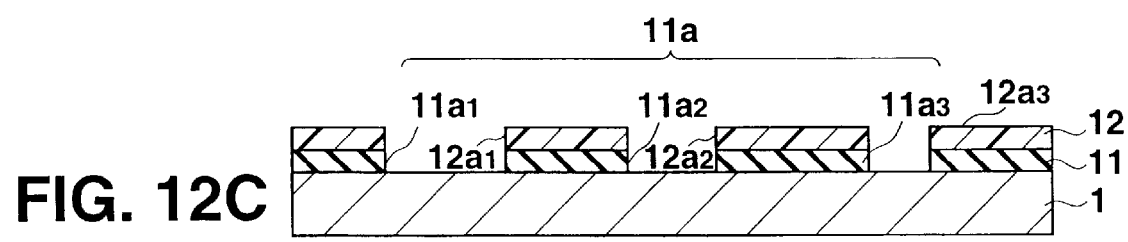
FIG. 12C

QUANTUM WIRES FORMED ON A SUBSTRATE, MANUFACTURING METHOD THEREOF, AND DEVICE HAVING QUANTUM WIRES ON A SUBSTRATE

This is a divisional of application Ser. No. 08/956,081, filed on Oct. 24, 1997 U.S. Pat. No. 5,976,957.

BACKGROUND OF THE INVENTION

1. Field of the Invention

The present invention relates to quantum wires formed on a substrate, a manufacturing method thereof, and a device having quantum wires on a substrate.

2. Description of the Related Art

By virtue of its nanometer-size effect, the quantum wire can provide novel physical properties that are different from bulk properties. For example, as shown in FIG. 1, in the silicon (Si) quantum wire, the band gap increases as the wire diameter decreases. Further, a material having an indirect transition band gap in a bulk state is changed to a material having a direct transition band gap. As a result, in the silicon quantum wire, the efficiency of light emission due to excited electron-hole recombination is increased remarkably and the emission wavelength is shifted to the shorter wavelength side, which enables visible light emission.

The silicon quantum wire which can provide the above physical properties is conventionally manufactured by etching a silicon substrate by electron beam lithography or some other method. However, it is difficult for this method to manufacture, in an integrated manner, silicon quantum wires having an equal shape over a wide area.

In view of the above, it has been proposed to growing a number of silicon quantum wires directly on a silicon substrate by using a VLS (vapor-liquid-solid) method (refer to E. I. Givargizov, J. Vac. Sci. Techno. B11 (2), pp. 449). In this method, after melted alloy droplets of silicon and gold are formed on the surface of a silicon substrate by evaporating gold (Au) on the silicon substrate, silicon quantum wires are grown by heating the substrate while supplying a material gas of silicon (refer to Wagner et al., Appl. Phys. Lett. 4, No. 5, pp. 89, 1964, and Givargizov, J. Cryst. Growth, 31, pp. 20, 1975).

SUMMARY OF THE INVENTION

An object of the present invention is to provide a manufacturing method of quantum wires that has a small diameter and hence can provide sufficient quantum effects, a manufacturing method of such quantum wires, and a device having quantum wires.

The invention provides a manufacturing method of a quantum wire, comprising the steps of evaporating, on a silicon substrate, a metal to serve as a catalyst in a decomposition reaction of a silicon material gas; growing a silicon wire on a surface of the silicon substrate by heating the silicon substrate on which the metal is evaporated in an atmosphere containing the silicon material gas and thereby decomposing the silicon material gas with the metal serving as a catalyst; oxidizing the silicon wire thus grown to form an oxide film in a surface portion; removing the metal at a tip of the silicon wire; and removing the oxide film.

The invention provides another manufacturing method of a quantum wire, comprising the steps of evaporating, on a silicon substrate, a metal that forms a melted alloy droplet with silicon; and growing, after the evaporating step, a silicon quantum wire by heating the silicon substrate to 400° C. or less in an atmosphere containing, at 0.5 Torr or more, a silicon material gas that produces silicon by a decomposition reaction thereof and can have a negative variation in Gibbs free energy in the decomposition reaction at 400° C. or less.

The invention provides a device having a plurality of wires on a substrate, wherein forming positions of respective ones of the plurality of wires are controlled.

The invention provides a manufacturing method of a wire, comprising the steps of forming a mask having an opening on a substrate; evaporating a metal to become a catalyst during growth of a wire on the substrate on which the mask is formed; and growing a wire in the opening on the substrate by heating the substrate on which the metal is evaporated in an atmosphere containing a material gas for the wire.

BRIEF DESCRIPTION OF THE DRAWINGS

FIG. 11 is a sectional view showing another modification of the device of FIG. 8;

FIGS. 12A–12C are sectional views showing respective steps of a manufacturing method of the device of FIG. 10;

DESCRIPTION OF THE PREFERRED EMBODIMENTS

Embodiments of the present invention will be hereinafter described in detail with reference to the accompanying drawings.

Embodiment 1

Figure 1:
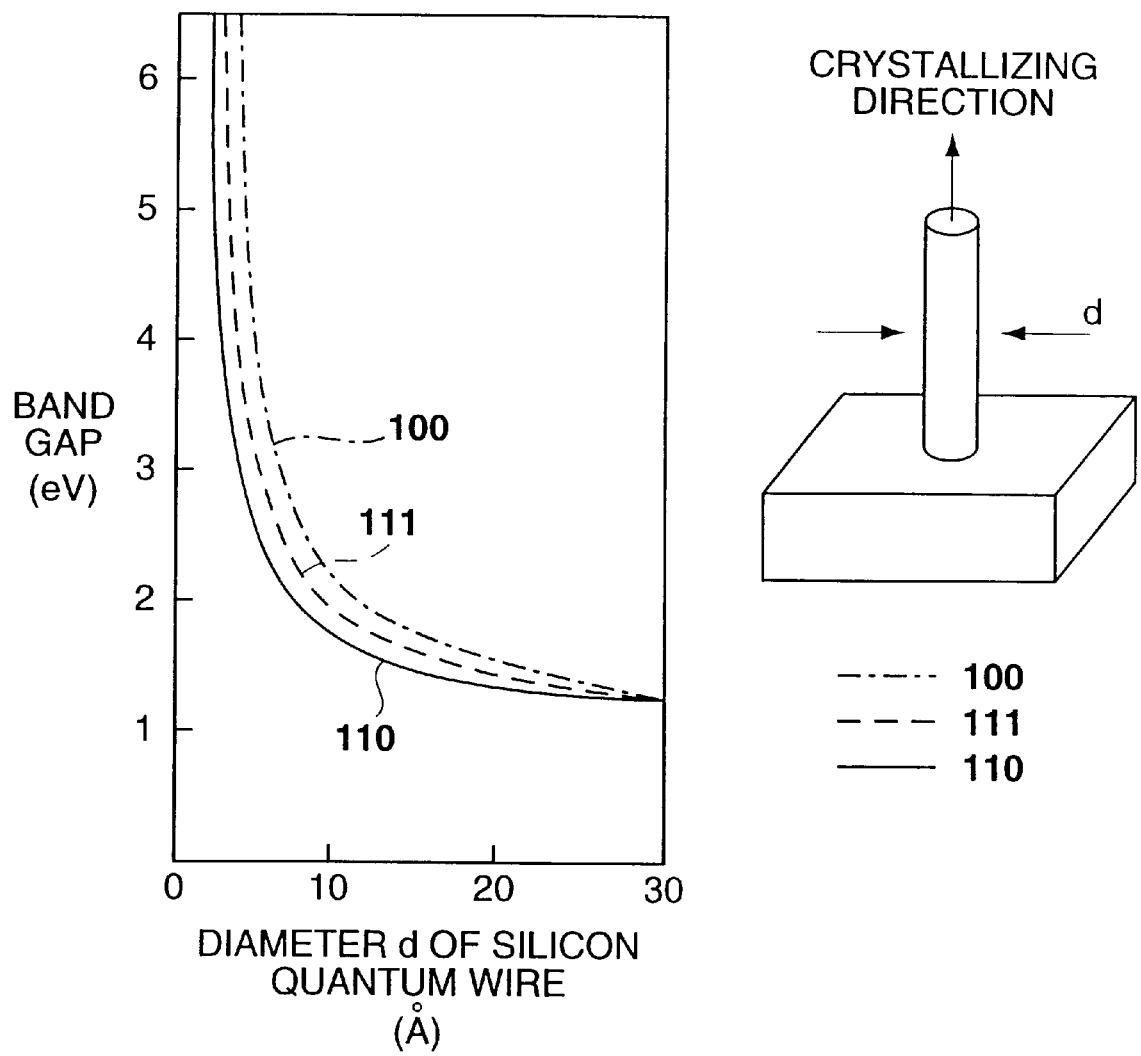
FIG. 1 shows a relationship between the diameter of a silicon quantum wire and the band gap.
Figure 2A:
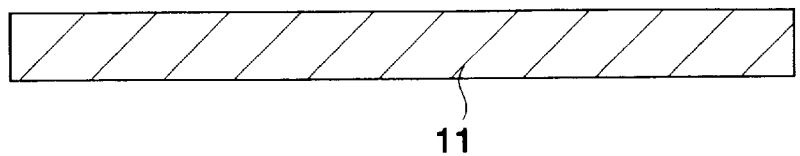
FIGS. 2A–2D are sectional views showing respective steps of manufacturing methods of a quantum wire according to a first and second embodiments of the present invention.

FIGS. 2A–2D and 3A–3C show a manufacturing method of a quantum wire according to a first embodiment of the invention. In this embodiment, first, as shown in FIG. 2A, a (111) silicon (Si) substrate 11 having resistivity of 0.4–4Ω·cm, for instance, is inserted in a vacuum container (not shown) and its surface is cleaned by heating it at 1,000° C. and $5 \times 10^{-8}$ Torr, for instance.

Figure 2B:
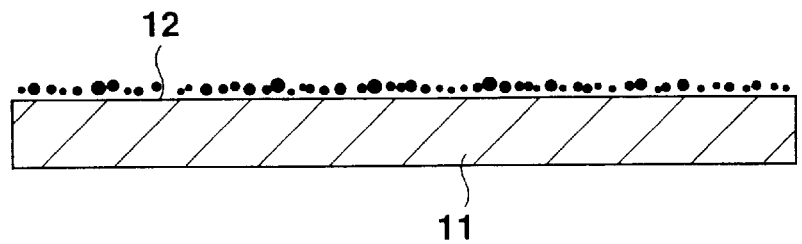
Figure 2C:
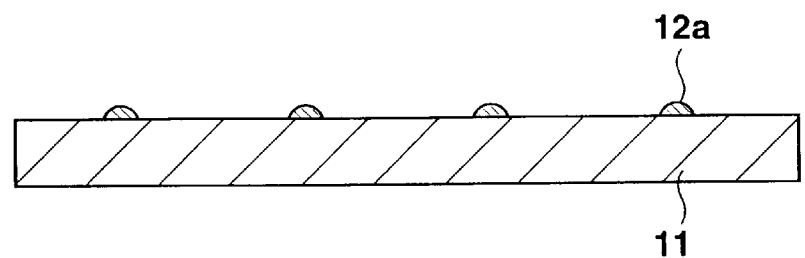

Then, as shown in FIG. 2B, while the silicon substrate 11 is heated to 450° C. or more, gold (Au) 12 to serve as a catalyst in a decomposition reaction of a silicon material gas is evaporated on the surface of the silicon substrate 11 at a thickness of 0.6 nm, for instance (evaporation step). For example, the silicon substrate 11 is heated, preferably at 450–650° C., by causing DC current to flow through the silicon substrate 11 along its longitudinal direction. For example, gold 12 is evaporated by using a tungsten (W) filament. As a result, gold 12 locally melts silicon at the surface of the silicon substrate 11 and coheres to form melted alloy droplets 12a as shown in FIG. 2C.

The reason why the evaporation thickness of gold 12 in the evaporation step is as small as 0.6 nm is to make the melted alloy droplets 12a smaller to thereby make thinner the silicon wires 13 that will be grown in a later wire growing step (see FIG. 2D).

Figure 2D:
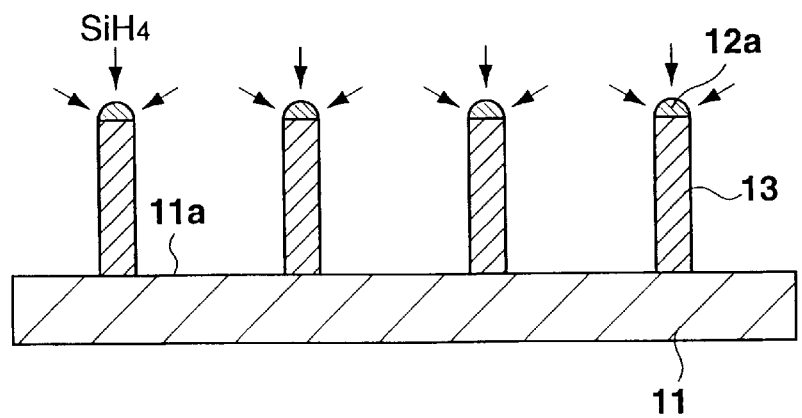

Thereafter, as shown in FIG. 2D, while the silicon substrate 11 is heated to 450° C. or more (preferably 450°–650° C.), a silane ($SiH_4$) gas, for instance, as a silicon material gas is introduced into the vacuum container (not shown) (wire growing step). The amount of silane gas to be introduced is adjusted so that the pressure of the silane gas in the vacuum container (not shown) becomes lower than 0.5 Torr, for instance (preferably lower than 0.15 Torr).

As a result, the silane gas is decomposed by a decomposition reaction shown in Formula (1) with the melted alloy droplets 12a serving as a catalyst, to form silicon. The silane gas decomposition reaction does not occur on a surface 11a of the silicon substrate 11 where the melted alloy droplets 12a do not exist.

$$SiH_4 \rightarrow Si + 2H_2 \quad (1)$$

Silicon that has been formed by the decomposition of the silane gas diffuses into the melted alloy droplets 12a and epitaxially bonds to the interface between the melted alloy droplets 12a and the silicon substrate 11. As a result, as shown in FIG. 2D, silicon wires 13 of about 10–100 nm in diameter grow on the silicon substrate 11. The thickness of the silicon wires 13 is determined by the diameter of the melted alloy droplets 12a.

Figure 4:
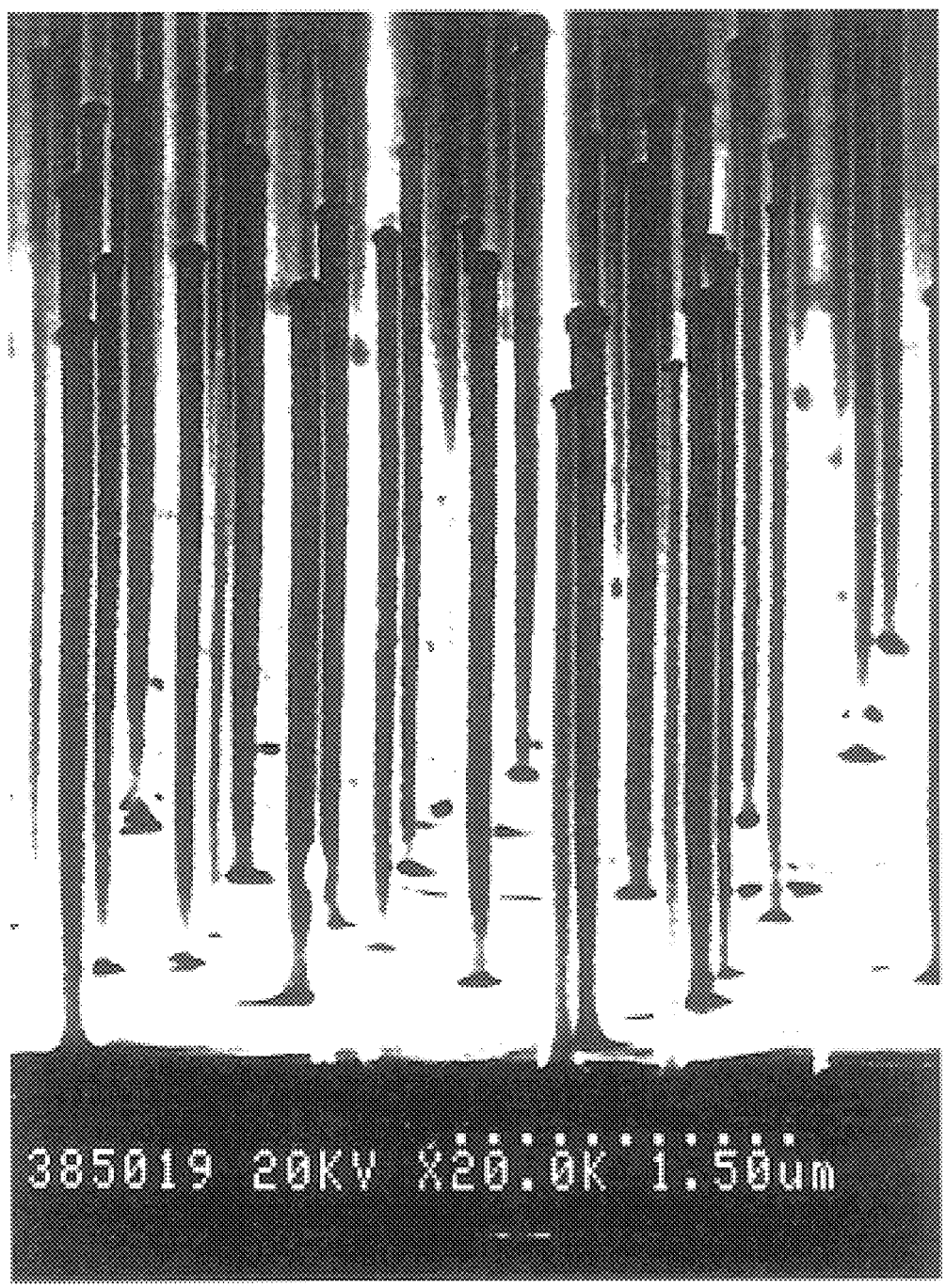
FIG. 4 is a SEM photograph of silicon wires grown by the method according to the first embodiment of the invention.

FIG. 4 is an SEM (scanning electron microscope) photograph of an example of silicon wires 13 that were grown in the above manner. This photograph was taken obliquely from above the silicon substrate 11. The silicon wires 13 were grown for about one hour at a heating temperature of 500° C. and at a silane gas pressure of 10 mTorr. Thus, the silane wires of about 100 nm in diameter are grown approximately perpendicularly to the silicon substrate 11.

The reason why a silane gas is used as the silicon material gas in the wire growing step is that a silane gas allows growth of silicon wires 13 having a uniform thickness profile in the longitudinal direction (see FIG. 4) as well as a sufficiently small diameter.

By setting the heating temperature of the silicon substrate 11 and the silane gas pressure at 450° C. or more and lower than 0.5 Torr, respectively, in the wire growing step, the silicon wires 13 grow perpendicularly to the silicon substrate 11, so that the silicon wires 13 having the good shape as shown in FIG. 4 can be obtained.

Further, by setting the heating temperature of the silicon substrate 11 preferably at 650° C. or less in the wire growing step, the silicon wires 13 can be formed at a sufficiently small diameter.

Figure 3A:
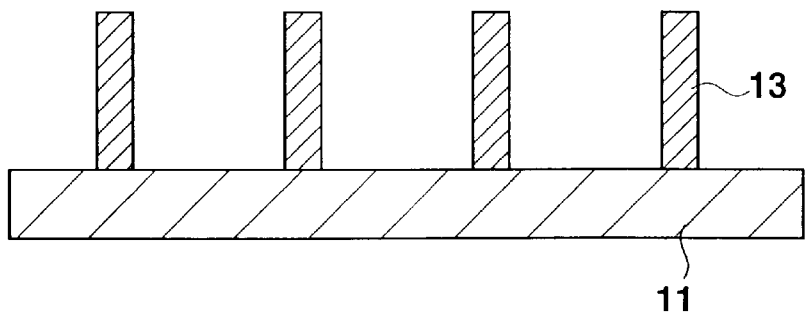
FIGS. 3A–3C are sectional views showing respective steps following the step of FIG. 2D.

After the silicon wires 13 have been grown in the above manner, they are immersed in aqua regia ($HNO_3:HCl=1:3$) of 35° C. for one minute to etch and remove the alloy droplets (i.e., gold that was evaporated on the surface of the silicon substrate 11) at the tips of the silicon wires 13, as shown in FIG. 3A (metal removal step). As a result, a state is obtained that only the silicon wires 13 remain on the surface of the silicon substrate 11.

Figure 3B:
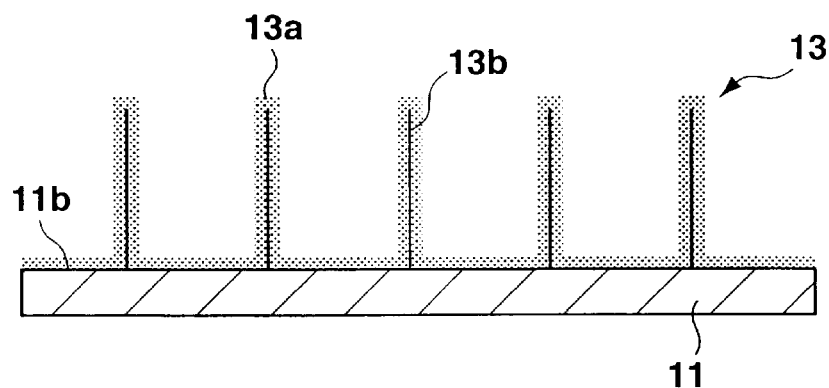

Subsequently, as shown in FIG. 3B, the silicon substrate 11 on which the silicon wires 13 are grown is heated at 700° C. for a proper time in an atmosphere containing an oxygen ($O_2$) gas (oxygen gas pressure: 500 Torr), for instance (oxidation step). As a result, oxide films 13a and 11b are formed in the surface portions of the silicon wires 13 and the silicon substrate 11, and silicon quantum wires 13b whose diameter is smaller than the diameter of the silicon wires 13 by the thickness of the oxide films 13a and is, for instance, less than 10 nm are formed in the central portions of the respective silicon wires 13.

Figure 3C:
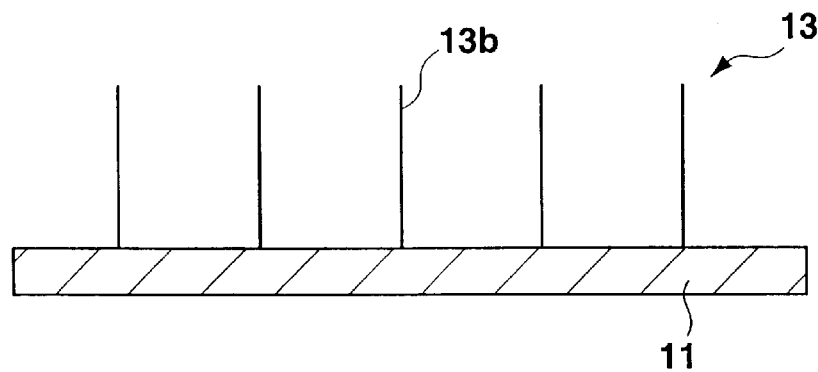

After the oxidation of the silicon wires 13, as shown in FIG. 3C, the substrate is immersed in HF (50%) at the room temperature for one minute, whereby the oxide films 13a and 11b in the surface portions of the silicon wires 13 and the silicon substrate 11 are etched and removed (oxide film removal step). As a result, a state is obtained in which only the silicon quantum wires 13b remain on the surface of the silicon substrate 11. Thus, the silicon quantum wires 13b having a sufficiently small diameter are obtained.

Figure 5A:
FIGS. 5A and 5B are TEM photographs of silicon quantum wires formed by the method according to the first embodiment of the invention.
Figure 5B:
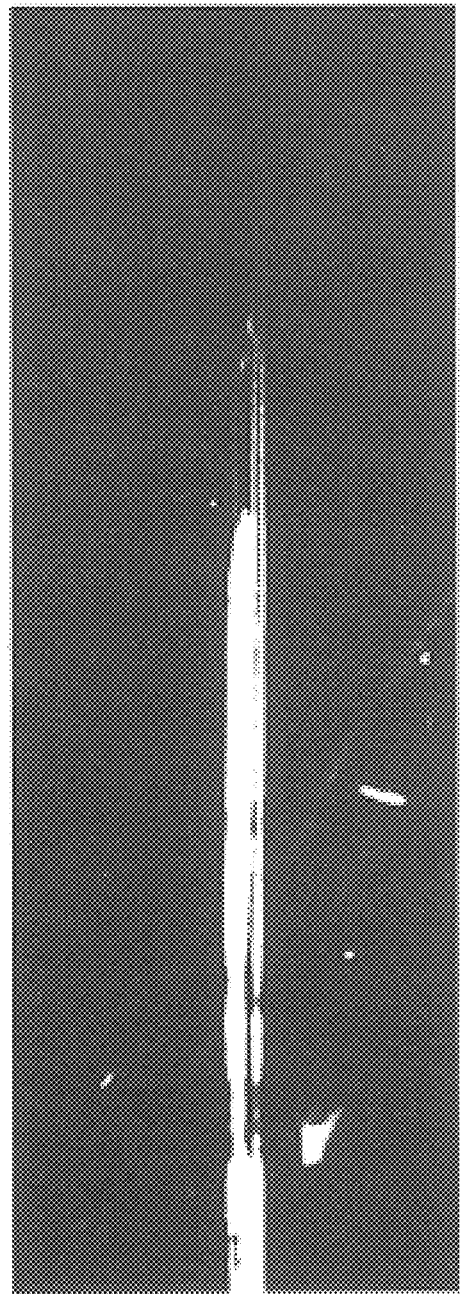

FIGS. 5A and 5B are TEM (transmission electron microscope) photographs of an example of a silicon quantum wire 13b. FIG. 5A is a TEM bright field image of a silicon wire 13 before being subjected to oxidation and FIG. 5B is a TEM dark field image of a silicon quantum wire 13b (Si core portion) obtained after the oxidation step. The silicon quantum wire 13b was formed by heating a silicon wire 13 of about 25 nm in diameter at 700° C. for one hour in an oxygen gas atmosphere of 500 Torr. Thus, the silicon quantum wire 13b that is about 15 nm in diameter and has a good shape was formed.

As described above, in the manufacturing method of a quantum wire according to the first embodiment, melted alloy droplets 12a are formed on the surface of a silicon substrate 11, then silicon wires 13 are grown the silicon substrate 11 by decomposing a silicon material gas with the melted alloy droplets 12a used as catalysts, and finally the surface portions of the silicon wires 13 are oxidized. Therefore, silicon quantum wires 13b that have a sufficiently small diameter and hence can provide sufficient quantum effects.

Further, in this manufacturing method of a quantum wire, since gold 12 is evaporated at as small a thickness as 0.6 nm, melted alloy droplets 12a can be made small, which allows growth of silicon wires 13 having a sufficiently small diameter. That is, silicon quantum wires 13b having a small diameter can be formed.

Still further, in this manufacturing method of a quantum wire, since a silane gas is used as a silicon material gas in the wire growing step, silicon wires 13 having a sufficiently small diameter and a uniform thickness profile in the longitudinal direction can be grown. That is, silicon quantum wires 13b having a small diameter and a good shape can be obtained.

In addition, in this manufacturing method of a quantum wire, since the substrate is heated to 450° C. or more in a silane gas atmosphere of less than 0.5 Torr in the wire growing step, silicon wires 13 can be grown approximately perpendicularly to a silicon substrate 11. That is, silicon quantum wires 13b having a good shape can be obtained.

The invention is not limited to the above-described first embodiment and various modifications are possible. For example, in the embodiment, gold 12 is evaporated in the evaporation step while the silicon substrate 11 is heated, and the melted alloy droplets 12a are formed on the surface of the silicon substrate 11 during the evaporation. Alternatively, melted alloy droplets 12a may be formed by heating the substrate in an atmosphere containing a silane gas after gold 12 is evaporated on the silicon substrate 11. As a further alternative, melted alloy droplets 12a may be formed by evaporating gold 12 on the silicon substrate 11 and then heating the substrate before introduction of a silane gas.

Further, in the first embodiment, gold 12 is evaporated on the surface of the silicon substrate 11 at a thickness of 0.6 nm in the evaporation step so that the size of the melted alloy droplets 12a is made small. The size of the melted alloy droplets 12a can be made sufficiently small, i.e., equivalent to the size in the embodiment as long as the thickness of gold 12 is 5 nm or less.

Further, although in the first embodiment gold 12 is used as the metal to serve as a catalyst in the decomposition reaction of a silicon material gas in the evaporation step, platinum (Pt), silver (Ag), tin (Sn), and the like may be used instead of gold 12. Also in such a case, as in the case of gold 12, the element, when heated, locally melts silicon coheres to form melted alloy droplets on the surface of the silicon substrate 11. Further, when evaporated at a thickness of 5 nm or less, the above metal elements, like gold (i.e., as in the embodiment), can form sufficiently small melted alloy droplets.

In addition, although in the first embodiment a silane gas is directly introduced into the vacuum container (not shown) in the wire growing step, a silane gas may be introduced into the vacuum container after being diluted with an inert gas such as a helium (He) gas or an argon (Ar) gas.

Further, although in the first embodiment a silane gas is used as the silicon material gas in the wire growing step, a disilane ($Si_2H_6$) gas or a trisilane ($Si_3H_8$) gas, or even a mixed gas of at least two of a silane gas, a disilane gas, and a trisilane gas may be used instead of a silane gas. Even with such a gas other than a silane gas, silicon wires having a sufficiently small diameter and a good shape can be grown under the same conditions as with a silane gas.

In addition, not only a silane gas, a disilane gas, and a trisilane gas but also gases capable of producing silicon by a decomposition reaction, such as a silicon chloride ($SiCl_4$) gas that is diluted with a hydrogen ($H_2$) gas, may be used as the silicon material gas. In the latter case, the gas pressure and the heating temperature are determined properly for the kind of gas used.

Further, in the first embodiment, the alloy droplets 12a are removed after the wire growing step in which the silicon wires 13 are grown, and then the silicon wires 13 are oxidized. Alternatively, silicon wires 13 may be oxidized after the wire growing step, followed by removal of alloy droplets 12a. In this case, either the compound alloy droplets 12a or the oxide portions 13a may be removed first.

Still further, in the first embodiment, for example, the silicon wires 13 are heated to 700° C. in an oxygen-containing atmosphere with an oxygen gas pressure of 500 Torr in the oxidation step. The oxidation conditions are determined properly in accordance with the thickness of the silicon wires 13.

As described above, in the manufacturing method of a quantum wire according to the first embodiment, a metal to serve as a catalyst is evaporated on a silicon substrate, then silicon wires are grown on the silicon substrate, and finally the surface portions of the silicon wires are oxidized. Therefore, silicon quantum wires having a sufficiently small diameter can be formed. Thus, the invention has an advantage that sufficient quantum effects can be obtained.

Embodiment 2

A second embodiment of the invention will be hereinafter described in detail with reference to the drawings.

A manufacturing method of a quantum wire according to the second embodiment will be described also with reference to FIGS. 2A–2D. In this embodiment, as shown in FIG. 2A, first a silicon substrate is cleaned to remove an oxide from the surface.

Then, as shown in FIG. 2B, the substrate 11 is inserted into a reaction chamber (not shown). In a low-pressure state, a metal to form melted alloy droplets with silicon is evaporated on the surface of the silicon substrate 11, to form a metal layer 12 (evaporation step). Examples of the metal to form melted alloy droplets with silicon are gold, silver (Ag), and indium (In); it is preferable to form the metal layer 12 by evaporating at least one of these metals. It is preferable that the thickness of the metal layer be 5 nm or less. This is to form small melted alloy droplets 12a (see FIG. 2C) in a later growing step (described layer).

Then, after the silicon substrate 11 is heated to 400° C. or less, a silicon material gas is introduced into the reaction chamber (not shown) while the temperature is maintained (growing step). The silicon material gas is to produce silicon by a decomposition reaction. The pressure of the silicon material gas is adjusted to 0.5 Torr or more. As a result, as shown in FIG. 2C, the metal layer 12 on the surface of the silicon substrate 11 locally melts silicon and coheres, to form a plurality of melted alloy droplets 12a made from silicon and the metal. The melted alloy droplets 12a serve as catalysts of the decomposition reaction of the silicon material gas, and the decomposition reaction of the silicon material gas occurs selectively in the melted alloy droplets 12a. That is, the decomposition reaction of the silicon material gas does not occur on a surface 11a of the silicon substrate 11 where the melted alloy droplets 12a do not exist.

Silicon produced by the decomposition reaction of the silicon material gas diffuses into the melted alloy droplets 12a, and epitaxially bonds to the silicon substrate 11 at the interface between the respective melted alloy droplets 12a and the silicon substrate 11. As a result, as shown in FIG. 2D, a plurality of silicon quantum wires 13 whose diameter is smaller than 20 nm are grown in the silicon substrate 11. The diameter of each silicon quantum wire 13 is determined by the diameter of the corresponding melted alloy droplet 12a.

In the above step, it is preferable that the silicon material gas be one in which a variation ($\Delta G$) in Gibbs free energy is small in its decomposition reaction. In particular, since in this step the decomposition reaction is cased at as low a temperature as 400° C. or less, it is preferable that a silicon material gas have a negative variation in Gibbs free energy in its decomposition reaction at a low temperature of 400° C. or less. That is, it suffices that a variation in Gibbs free energy of the decomposition reaction be a negative value at a certain temperature in the range of 400° C. or less.

Figure 6:
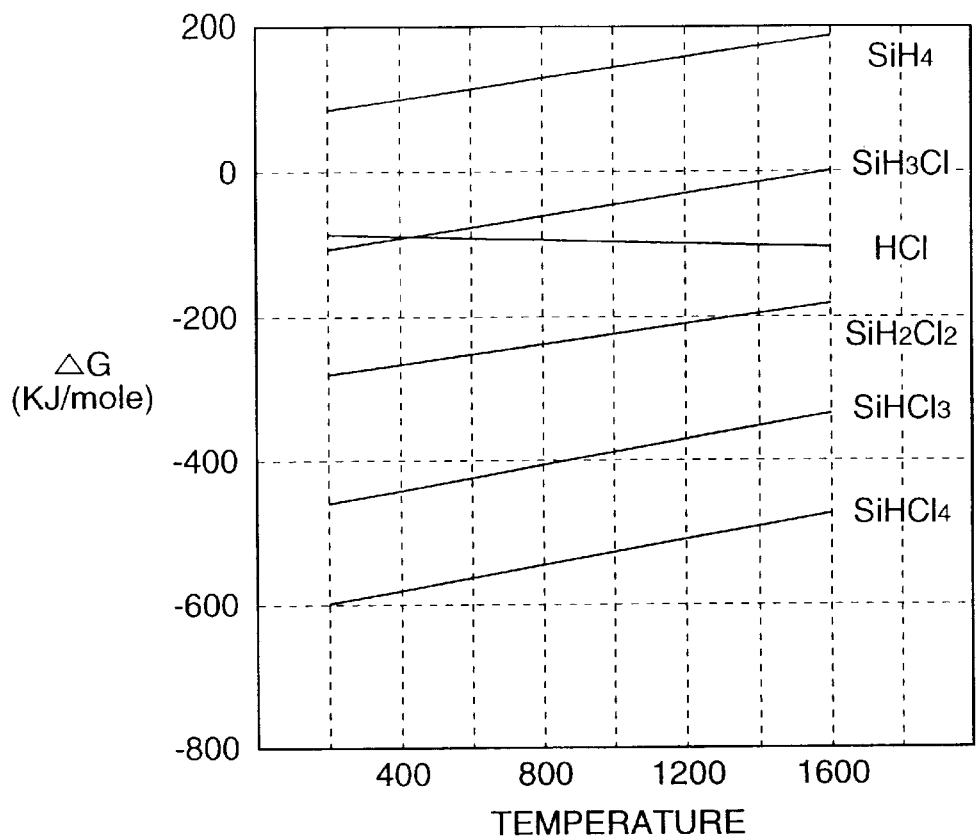
FIG. 6 is a graph showing a relationship between the temperature and the variation in Gibbs free energy of composition reactions of silane and silicon chloride.

For example, as shown in FIG. 6, in the case of the silane ($SiH_4$) gas, the variation in Gibbs free energy of the composition reaction is a positive value (negative value in the case of the decomposition reaction) from the high temperature to the low temperature (400° C. or less). Therefore, the silane gas is easily decomposed at a low temperature of 400° C. or less and hence is suitable for the intended use. On the other hand, in the conventionally used silicon chloride gas, the variation in Gibbs free energy of the composition reaction is a negative value (positive value in the case of the decomposition reaction) even at a high temperature of about 1,000° C.; it is not suitable for the intended use. Although not shown in FIG. 2, the disilane gas ($Si_2H_6$) gas and the trisilane ($Si_3H_8$) gas have negative variations in Gibbs free energy in their decomposition reactions at 400° C. or less, and hence they are also suitable for the intended use. A mixed gas of at least two of a silane gas, a disilane gas, and a trisilane gas may be used as the silicon material gas.

Figure 7:
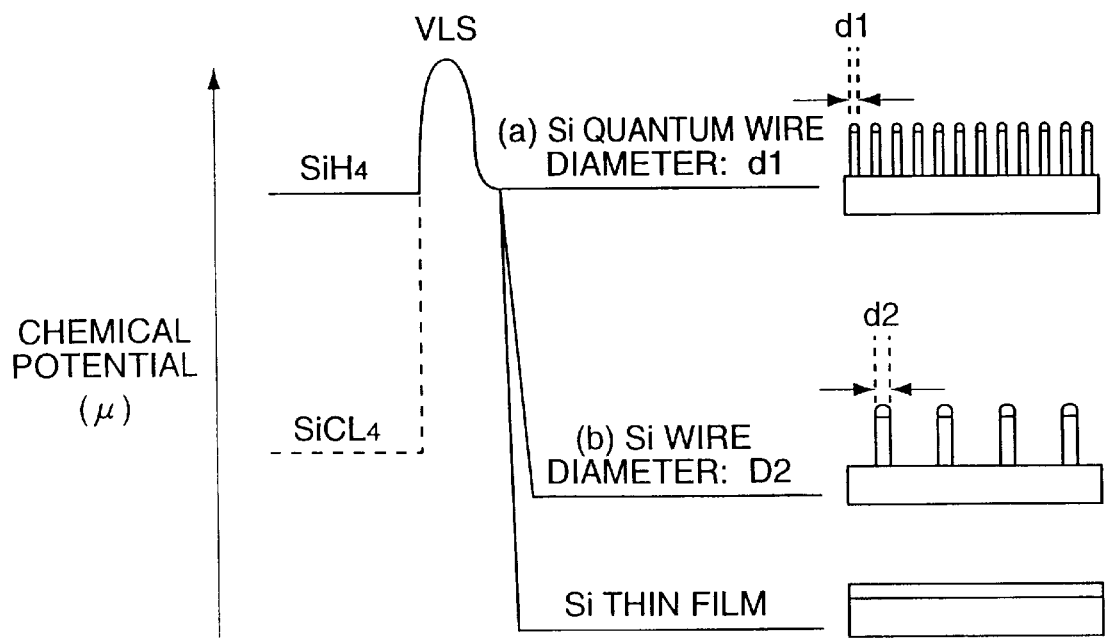
FIG. 7 shows variations in chemical potential in VLS reactions.

As show in FIG. 7 for an example of the silane gas, a substance having a small variation in Gibbs energy in a decomposition reaction has a relatively high chemical potential. Therefore, although the chemical potential of a silicon wire increases as its diameter decreases, the silicon gas allows growth of even silicon quantum wires 13 having small diameter. The chemical potential of silane is much higher than that of silicon chloride which is conventionally used (indicated by a broken line in FIG. 7), and hence is advantageous to growth of silicon quantum wires 13. For the above-described reason, in this embodiment, silicon quantum wires 13 grow even if the melted alloy droplets 12a have a small diameter.

Further, the reason why the heating temperature of the silicon substrate 11 is set at 400° C. or less and the pressure of the silicon material gas is set at 0.5 Torr or more is that the diameter of silicon quantum wires formed is smaller as the heating temperature is lower than the pressure of the silicon materials gas is higher, and silicon quantum wires 13 whose diameter is smaller than 20 nm can be grown when the heating temperature is 400° C. or less and the pressure of the silicon material gas is 0.5 Torr or more.

As described above, in the manufacturing method according to this embodiment, heating is performed at a temperature of 400° C. or less in an atmosphere containing, at a pressure of 0.5 Torr or more, a silicon material gas whose variation in Gibbs free energy of its decomposition reaction can be a negative value at 400° C. or less. Therefore, silicon quantum wires 13 whose diameter is smaller than 20 nm can be grown at a low temperature; that is, silicon quantum wires 13 that are sufficiently narrow to provide new physical properties can be grown directly.

Further, in this manufacturing method of a quantum wire, since the metal layer 12 is evaporated at a thickness of 5 nm or less, small melted alloy droplets 12a can be formed, which in turn allows growth of silicon quantum wires having a sufficiently small diameter.

A specific example of the second embodiment will be hereinafter described with reference to the drawings.

First, a polished n-type silicon wafer ((111) surface, ρ=0.4Ω·cm) was prepared and cut into rectangular silicon substrates 11 (1 cm×5 cm). After the silicon substrates 11 were cleaned in acetone, they were etched with a mixed solution of nitric acid ($HNO_3$) and hydrofluoric acid (HF) to remove an oxide from their surfaces (see FIG. 2A).

Then, each silicon substrate 11 was introduced into a reaction chamber (not shown) and the pressure inside the reaction chamber was reduced to 5×10$^{-8}$ Torr. Thereafter, gold was evaporated on the surface of the silicon substrate by using a tungsten (W) filament, so that a 0.6-nm-thick metal layer 12 was formed (see FIG. 2B).

Then, after the silicon substrate 11 was heated, a silane gas that was diluted with a helium (He) gas to 10% was introduced into the reaction chamber (not shown) as a silicon material gas while the substrate temperature was maintained. As a result, a plurality of melted alloy droplets 12a were formed on the surface of the silicon substrate 11, the silane gas was decomposed in the respective melted alloy droplets 12a according to Formula (1), and a plurality of silicon quantum wires 13 grew (see FIGS. 2C and 2D).

$$SiH_4 \rightarrow Si + 2H_2 \qquad (1)$$

In the above step, the flow rate of the mixed gas containing the silane gas was set at 40 sccm and the partial pressure of the silane gas was varied in a range of 0.01–1 Torr. The heating was performed by causing DC current to flow through the silicon substrate 11 along its longitudinal axis and the heating temperature was varied in a range of 320° C.–440° C. The temperature of the silicon substrate 11 was measured with an optical high temperature meter and a thermocouple.

Figure 8:
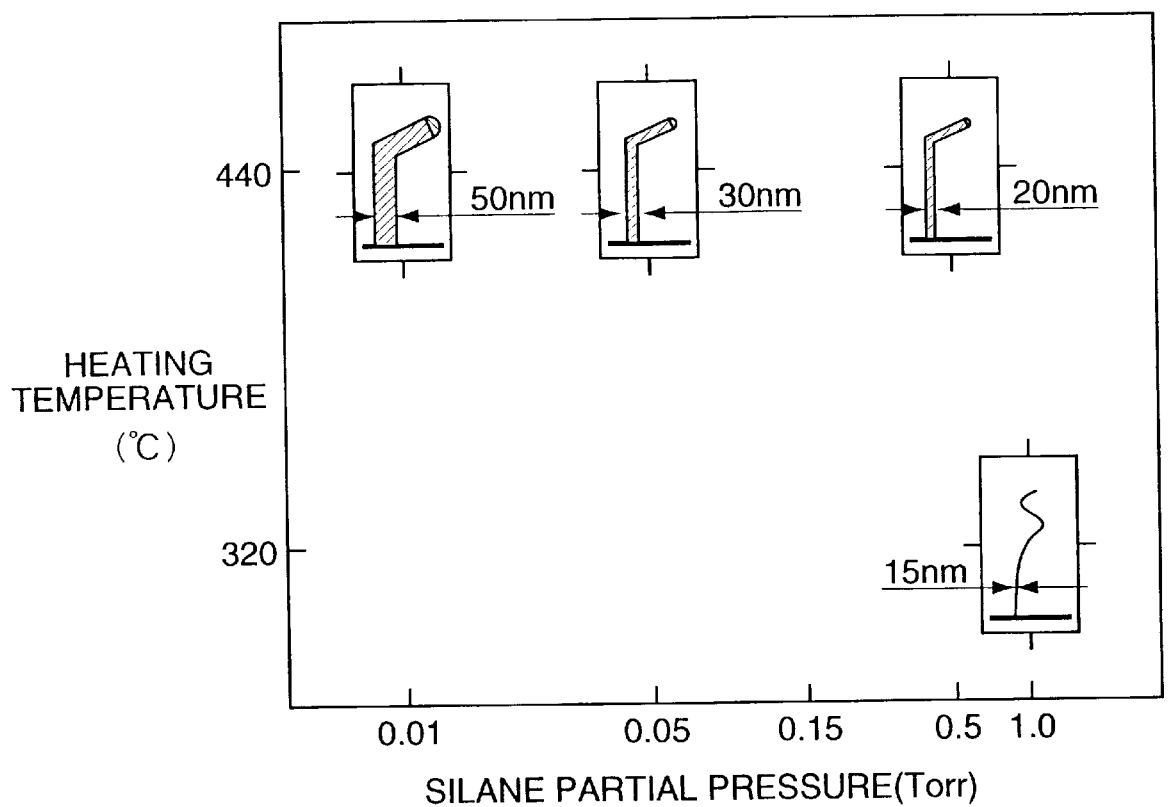
FIG. 8 is a correlation diagram showing results of SEM observations of silicon quantum wires that were grown while the pressure of a silane gas and the heating temperature were varied in an example of the second embodiment.

Silicon quantum wires 13 thus grown were observed with a scanning electron microscope (SEM). FIG. 8 shows observation results. FIG. 8 shows a relationship between the silane gas partial pressure/heating temperature and the form/thickness of the silicon quantum wire 13.

As seen from FIG. 8, the silicon quantum wire 13 had a smaller diameter when the heating temperature was lower and the silane gas pressure was higher. While the diameter was 20 nm when the heating temperature was 440° C. and the silane gas pressure was 0.5 Torr, it was made as small as 15 nm when they were 320° C. and 1 Torr. It has become apparent that the diameter of the silicon quantum wire 13 can be made smaller than 20 nm when the heating temperature is 400° C. or less and the silane gas pressure is 0.5 Torr or more.

Although the invention has been described above by using the embodiment and the example, the invention is not limited to those and various modifications are possible. For example, although in the above embodiment and example the melted alloy droplets 12a are formed by heating the silicon substrate 11 after evaporating the metal thereon and before introducing the silicon material gas, melted alloy droplets 12a may be formed by heating the silicon substrate 11 in an atmosphere containing a silicon material gas after evaporating a metal on the silicon substrate 11. As a further alternative, a metal may be evaporated while the silicon substrate 11 was heated, in which case melted alloy droplets 12a are formed during the evaporation.

Further, although in the above example the silicon material gas (silane gas) is introduced into the reaction chamber such that it is diluted with a helium gas, it may be diluted with some other inert gas such as an argon (Ar) gas, or only the silicon material gas may be introduced without being diluted.

Still further, although the above example is only directed to the case where a silane gas used as the silicon material gas, the same results can be obtained even in a case where a disilane gas or a trisilane gas is used.

As described above, in the manufacturing method according to the second embodiment, heating is performed at a temperature of 400° C. or less in an atmosphere containing, at a pressure of 0.5 Torr or more, a silicon material gas whose variation in Gibbs free energy of its decomposition reaction can be a negative value at 400° C. or less. Therefore, silicon quantum wires whose diameter is smaller than 20 nm can be grown at a low temperature. Thus, an advantage is obtained that silicon quantum wires that are sufficiently narrow to provide new physical properties can be grown directly.

Embodiment 3

A third embodiment of the invention will be hereinafter described in detail with reference to the drawings.

Figure 9:
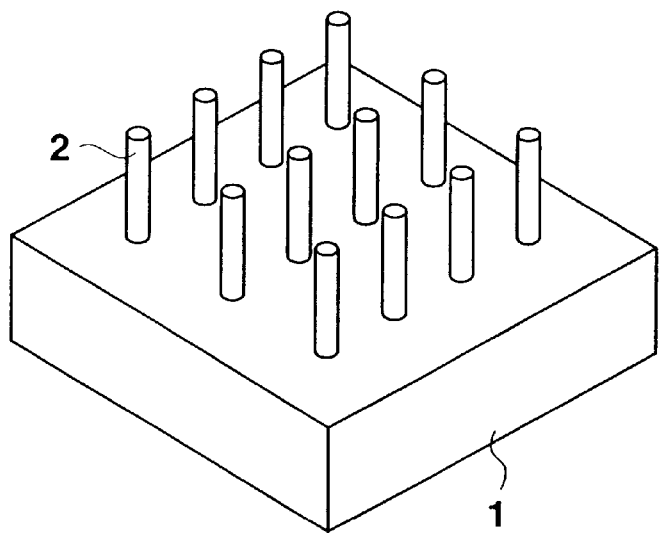
FIG. 9 is a perspective view showing the configuration of a device having wires according to a third embodiment of the invention.

FIG. 9 shows the configuration of a device having wires according to the third embodiment. The device has a plurality of silicon single crystal wires 2 which are formed on a silicon single crystal substrate 1 so as to be approximately perpendicularly to the substrate 1. The forming positions of the respective wires 2 are controlled so as to be arranged periodically. In the device shown in FIG. 9, the wires 2 are arranged at regular intervals in both longitudinal and lateral directions.

Figure 10:
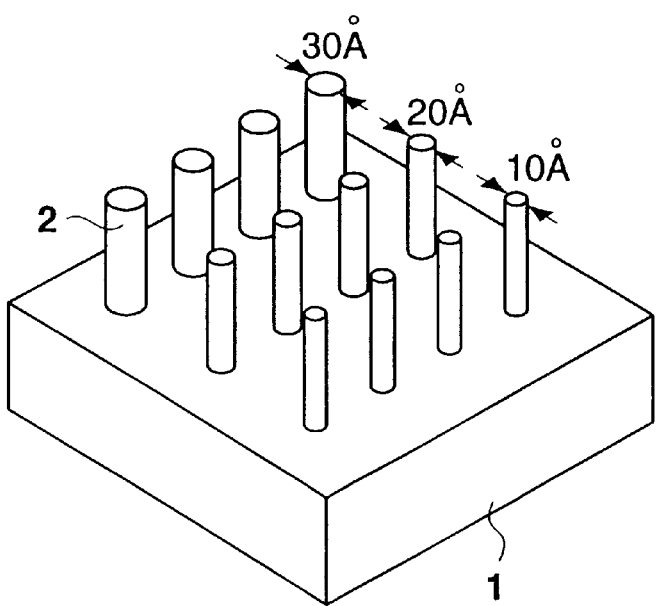
FIG. 10 is a perspective view showing a modification of the device of FIG. 9.

The thicknesses of the respective wires 2 are controlled. In the device of FIG. 9, the wires 2 are given the same thickness. As shown in FIG. 10, the wires 2 may be given different thicknesses. For example, where this device is to be used as a light-emitting device utilizing the optical characteristics of the wires 2, light of a single wavelength can be emitted by equalizing the thicknesses of the respective wires 2 as shown in FIG. 9. If the thicknesses of the respective wires 2 are varied properly as shown in FIG. 10, a single device can emit light beams of a plurality of wavelengths. In the device of FIG. 10, the thicknesses of the respective wires 2 are changed on a column-by-column basis to emit light beams of three kinds of waveforms. For example, the thickest wires 2 having a diameter of 30 Å, the medium thickness wires 2 having a diameter of 20 Å, and the narrowest wires 2 having a diameter of about 10 Å emit red light, green light, and blue light, respectively.

Further, as shown in FIG. 11, this device may be used in a self-emission flat display as an array device in which interconnections are connected to the wires 2 in matrix form. In the device of FIG. 11, a plurality of interconnections 1a having a conductivity type (n or p) that is opposite to a conductivity type (p or n) of a substrate 1 are formed on the surface of the substrate 1, and wires 2 are formed on the interconnections 1a. An insulating film 3 made of silicon dioxide ($SiO_2$) or a proper resin is formed between the wires 2. A plurality of contact lines 4 are formed, with a proper metal, on the wires 2 in the direction perpendicular to the interconnections 1a. Thus, in this device, the wires 2 are connected individually.

As described above, in the device having wires according to the embodiment, since the forming positions of the respective wires 2 are controlled, the respective wires 2 can be arranged at given positions that are designed for an intended use; the device can be put into practical use. For example, a matrix type array device can be obtained in which the wires 2 are arranged periodically.

Further, since the thicknesses of the respective wires are controlled, the thicknesses of the respective wires 2 can be adjusted to arbitrarily given values in accordance with an intended purpose. Therefore, device having wires 2 of uniform thicknesses and a device in which wires 2 of different thicknesses are arranged and which therefore can emit visible light beams of a plurality of wavelengths.

The device having the o above structure can be manufactured in the following manner.

FIGS. 12A–12C and 13A–13D show manufacturing steps of the device according to the embodiment. FIGS. 12A–12C and 13A–13D show manufacturing steps of the device shown in FIG. 10, as a typical example. First, as shown in FIG. 12A, a (111) single crystal silicon substrate 1 having resistivity of 0.4–4 Ω·cm, for instance, is inserted in a reaction furnace and oxidized therein, so that an oxide film of, for instance, about 100 nm in thickness as a formation assisting film 11 is formed on the surface of the substrate 1.

Then, as shown in FIG. 12B, after a photoresist film 12 is applied to the substrate on which the formation assisting film 1 is formed, it is selectively exposed and openings 12a of proper sizes are formed at positions corresponding to forming positions of wires 2. For example, to form the device of FIG. 10, openings $12a_1$ having a diameter of about 1 μm, openings $12a_2$ having a diameter of about 0.8 μm, and openings $12a_3$ having a diameter of about 0.6 μm are formed for the respective columns at positions of regular intervals in both longitudinal and lateral directions.

Subsequently, the substrate 1 is cut into a proper size (for instance, a rectangle of 1 cm×4.5 cm). Thereafter, as shown in FIG. 12C, the formation assisting film 11 is etched for a proper time (for instance, 5 minutes) with the photoresist film 12 used as a mask with an etching liquid containing hydrogen fluoride (HF), and a plurality of holes 11a corresponding to the forming positions of respective wires 2 are thereby formed in the formation assisting film 11. For example, in the case of forming the device shown in FIG. 10, holes $11a_1$ having a diameter of about 1 μm, holes $11a_2$ having a diameter of about 0.8 μm, and holes $11a_3$ having a diameter of about 0.6 μm are formed for the respective columns. As a result, the formation assisting film 11 as an assisting means is formed in which the holes 11a are formed so as to correspond to the forming positions of the respective wires 2 (the above steps belong to a formation assisting film forming step and an assisting means forming step). It is noted that if the holes 11a thus formed are too large, the thicknesses and the forming positions of the wires 2 cannot be controlled with high accuracy.

After the holes 11a are formed in the formation assisting film 11, the photoresist film 12 is removed with acetone, for instance. Thereafter, the substrate 1 is immersed in nitric acid ($HNO_3$) that has been heated to 70° C., for instance, for one minute, and then etched for 5 seconds with an etching liquid containing hydrofluoric acid, so that the portions of the surface of the substrate 1 that are exposed through the holes 11a of the formation assisting film 11 are cleaned.

Figure 13A:
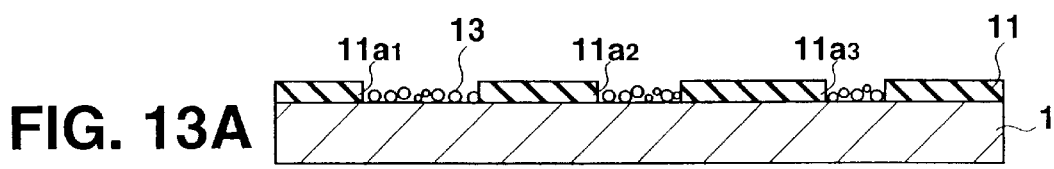
FIGS. 13A–13D are sectional views showing respective steps following the step of FIG. 12C.

After the cleaning of the substrate 1, it is dried and then inserted into a reaction furnace (not shown). After the pressure inside the reaction furnace is reduced, the substrate 1 is heated properly (to 700° C., for instance) and a metal (for instance, gold (Au)) to serve as a catalyst during formation of wires 2 is evaporated on the substrate 1 as shown in FIG. 13A (evaporation step) As a result, 3-nm-thick catalyst layers 13 are formed on the portions of the substrate 1 that are exposed through the respective holes 11a of the formation assisting film 11. No metal is evaporated on the formation assisting film 11 and hence the catalyst layers 13 are not formed thereon. In this case, for example, the substrate 1 is heated by causing DC current to flow through the substrate 1 along its longitudinal direction. The metal is evaporated for one minute by using a tungsten (W) filament, for instance.

Figure 13B:
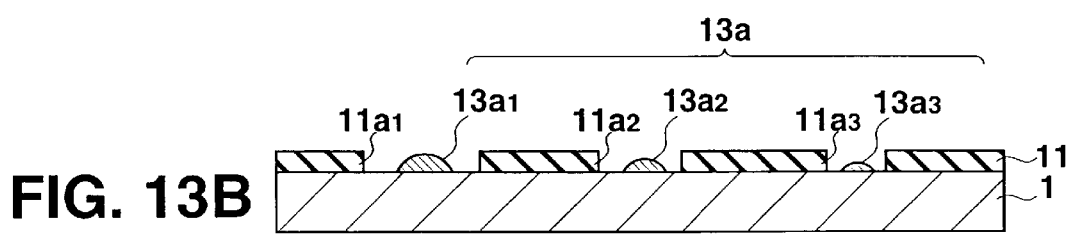

After the formation of the catalyst layers 13, the substrate 1 is kept heated properly (to 700° C., for instance) in the reaction chamber (not shown) for a proper time (for instance, 30 minutes) (heating step). As a result, the catalyst layers 13 that are exposed through the respective holes 11a of the formation assisting film 11 locally melt silicon at the surface of the substrate 1 and cohere to form melted alloy droplets as shown in FIG. 13B. For example, to form the device shown in FIG. 10, melted alloy droplets $13a_1$ having a diameter of about 1,000 Å, melted alloy droplets $13a_2$ having a diameter of about 900 Å, and melted alloy droplets $13a_3$ having a thickness of about 800 Å are formed in accordance with the sizes of the associated holes of the formation assisting film 11.

That is, the sizes of the respective melted alloy droplets 13a are controlled by the sizes of the associated holes 11a of the formation assisting film 11. Further, the sizes of the respective melted alloy droplets 13a depend on the thickness of the catalyst layers 13 that are evaporated in the evaporation step. For example, the sizes of the respective melted alloy droplets 13a decrease as the catalyst layers 13 are made thinner, and vice versa.

The heating step is executed for a sufficient time until a single melted alloy droplet 13a is formed in each hole all. Although this time depends on the sizes of the respective holes 11a of the formation assisting film 11 and the heating temperature, it is preferable that the heating step be executed for at least 10 minutes.

After the melted alloy droplets 13a are formed in the above manner, a silane (SiH$_4$) gas as a silicon material gas to constitute wires 2 is introduced into the reaction furnace (not shown) while the substrate 1 is heated to 450° C. or more (for instance, 700° C.) (wire growing step). The amount of the silane gas is adjusted so that the partial pressure of the silane gas in the reaction furnace becomes less than 0.5 Torr, preferably 0.15 Torr or less.

As a result, the silane gas is decomposed by a decomposition reaction according to Formula (1) with the melted alloy droplets 13a serving as catalysts.

$$SiH_4 \rightarrow Si + 2H_2 \qquad (1)$$

Figure 13C:
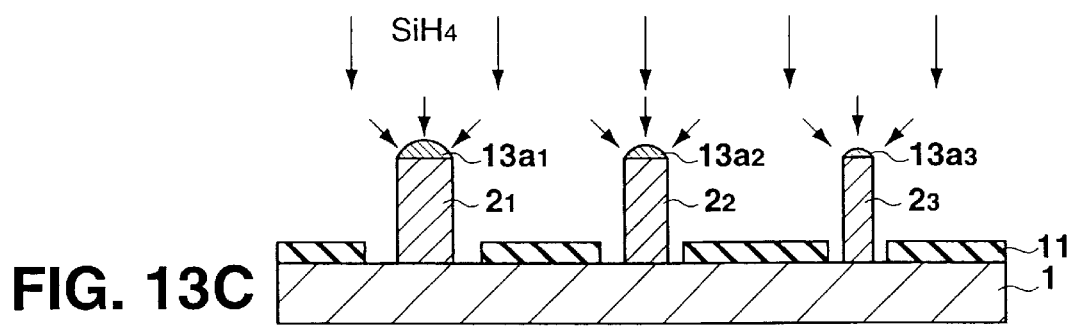

Silicon that is produced by the decomposition of the silane gas diffuses into the respective melted alloy droplets 13a and epitaxially bonds to the interfaces between the substrate 1 and the respective melted alloy droplets 13a. Therefore, as shown in FIG. 13C, wires 2 grow selectively under the respective melted alloy droplets 13a at thicknesses corresponding to the sizes of the respective melted alloy droplets 13a. That is, in the case of forming the device of FIG. 10, wires $2_1$ having a diameter of about 1000 Å, wires $2_2$ having a diameter of about 900 Å, and wires $2_3$ having a diameter of about 800 Å grow.

The reason why a silane gas is used as the silicon material gas in the wire growing step is that a silane gas allows growth of wires 2 having a uniform thickness profile in the longitudinal direction as well as a sufficiently small diameter. Further, by setting the heating temperature of the silicon substrate 1 and the silane gas partial pressure at 450° C. or more and lower than 0.5 Torr, respectively, wires 2 having a good shape can be obtained.

After the wires 2 have been grown for about 20 minutes in the above manner, the substrate is immersed in, for instance, aqua regia (HNO$_3$:HCl=1:3) of 35° C. for one minute to etch and remove the alloy droplets 13 at the tips of the respective wires 2 and the catalyst layers 13 on the formation assisting film 11.

Figure 13D:
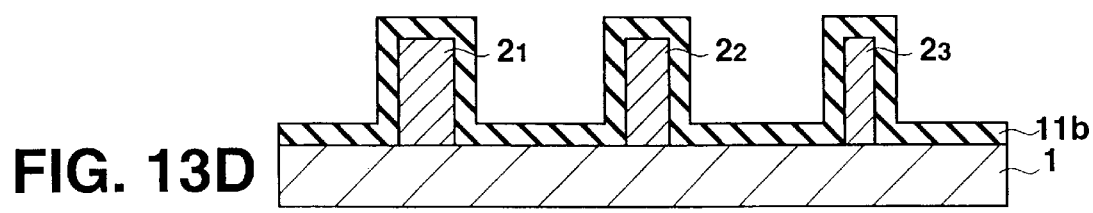

Thereafter, as shown in FIG. 13D, for example, the substrate on which the wires 2 are grown is heated at 700° C. for a proper time in an atmosphere containing an oxygen (O$_2$) gas at 500 Torr (oxidation step). As a result, an oxide film 11b including the formation assisting film 11 is formed on the surfaces of the wires 2 and the substrate 1, so that the diameters of the respective wires 2 are reduced by the thickness of the oxide film 11b. For example, in the case of forming the device of FIG. 10, the diameters of the wires $2_1$, $2_2$, and $2_3$ are reduced to about 30 Å, 20 Å, and 10 Å, respectively, to allow them to emit light beams of red, green, and blue, respectively.

After the wires 2 have been oxidized in the above manner, the substrate 1 on which the wires 2 are formed are immersed in hydrogen fluoride at the room temperature for one minute if necessary, whereby the oxide film 11b (including the formation assisting film 11) on the surface of the wires 2 and the substrate 1. As a result, the device of FIG. 10 is formed.

In the above step, in a case where there occurs no problem even if the insulating film 3 is formed between the wires 2 as in the case of FIG. 11 or the oxide film 11b is formed around the wires 2, only unnecessary portions of the oxide film 11b may be removed and it need not necessary to remove the entire oxide film 11b.

In this manufacturing method, it was examined how the size of the hole 11a of the formation assisting film 11 and the heating step influence the wire 2. Results of this experiment will be described below.

First, in the same manner as described above, a substrate 1 was prepared and a formation assisting film 11 was formed. The formation assisting film 11 was provided with a region where a plurality of holes 11a having a diameter of 1.5 μm were formed and a region where a plurality of holes 11a having a diameter of 3 μm were formed. Thereafter, in the same manner as described above, gold was evaporated, then melted alloy droplets 13a were formed by heating of 30 minutes, and then wires 2 were grown. Thereafter, the wires 2 thus grown were observed with a scanning electron microscope (SEM).

It was observed that in the region where the 1.5-μm-diameter holes 11a were formed, one wire 2 was grown in each hole 11a and the thicknesses of the respective wires 2 were uniform. In contrast, in the region where the 3-μm-diameter holes 11a were formed, two wires 2 were grown in many holes 11a and the thicknesses of the respective wires 2 were not uniform. Thus, it is understood that the holes 11a of the formation assisting film 11 are too large, the forming positions and the thicknesses of wires 2 cannot be controlled.

Further, in the same manner as described above, a substrate 1 was prepared and a formation assisting film 11 was formed in which a plurality of 1.5-μm-diameter holes 11a were formed. Thereafter, in the same manner as described above, gold was evaporated, then melted alloy droplets 13a were formed by heating of one minute, and then wires 2 were grown. Thereafter, the wires 2 thus grown were observed with a SEM.

It was observed that a plurality of wires 2 were grown for each hole 11a and the thicknesses of the respective wires 2 were not uniform. Thus, it is seen that if the duration of the heating step is insufficient, melted alloy droplets 13a cannot cohere sufficiently and wires 2 grow such that a plurality of melted alloy droplets 13a exist in each hole 11a. That is, the forming positions and the thicknesses of the respective wires 2 cannot be controlled.

As described above, in this manufacturing method of a device having wires, since gold is evaporated on the substrate 1 through the formation assisting film 11, the forming position and the thickness of each wire 2 can be controlled in accordance with the position and the size of the associated hole 11a in the formation assisting film 11. Therefore, the wires 2 can be grown with high accuracy at designed forming positions and thicknesses.

One melted alloy droplet 13a is formed in each hole 11a of the formation assisting film 11 by heating of a sufficient time after the evaporation step and before the wire growing step. Therefore, one wire 2 can be grown for each hole 11a and the forming positions and the thicknesses of the respective wires 2 can be controlled with high accuracy.

Further, since the grown wires 2 are oxidized after the wire growing step, wires 2 having sufficiently small diameters can be formed with high accuracy.

The device according to the third embodiment can also be manufactured in the following manner.

Figure 14A:
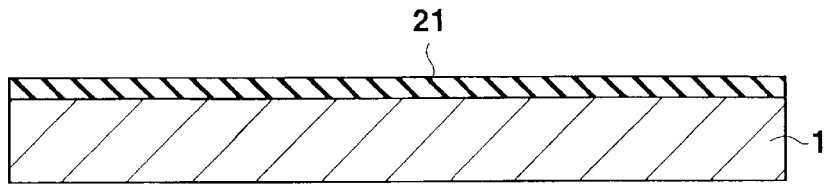
FIGS. 14A–14E are sectional views showing respective steps of another manufacturing method of the device of FIG. 10.

FIGS. 14A–14E and 15A–15C show manufacturing steps of another manufacturing method of the device according to the embodiment. FIGS. 14A–14E and 15A–15C also show manufacturing steps of the device shown in FIG. 10, as a typical example. First, as shown in FIG. 14A, a (111) single crystal silicon substrate 1 having resistivity of 0.4–4Ω·cm, for instance, is inserted in a reaction furnace and oxidized therein, so that an oxide film of, for instance, about 100 nm in thickness as a position control film 21 is formed on the (111) surface of the substrate 1.

Figure 14B:
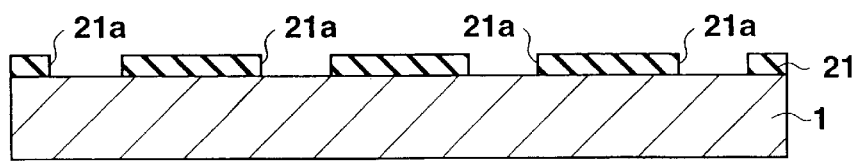
Figure 16:
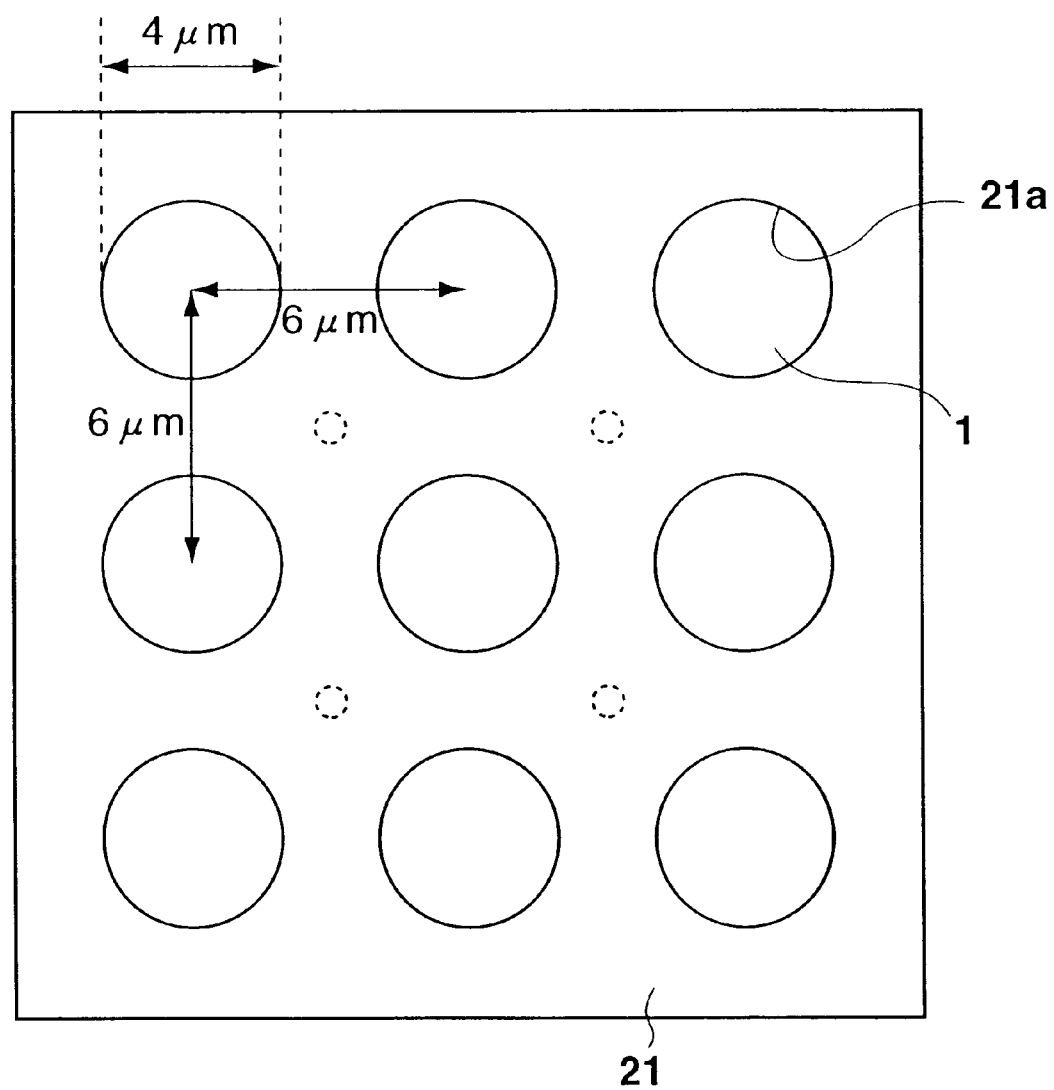
FIG. 16 is a plan view corresponding to FIGS. 14B and 14E.

Then, as shown in FIG. 14B, the position control film 21 is selectively etched by using, for instance, an etching liquid containing hydrogen fluoride and openings 21a having a proper size are thereby formed in a proper manner (for instance, periodically) (position control film forming step). For example, in the case of forming the device shown in FIG. 10, a plurality of openings 21a of about 4 μm in diameter are formed so as to have constant center-to-center intervals of about 6 μm in both longitudinal and lateral directions as shown in a plan view of FIG. 16.

Figure 14C:
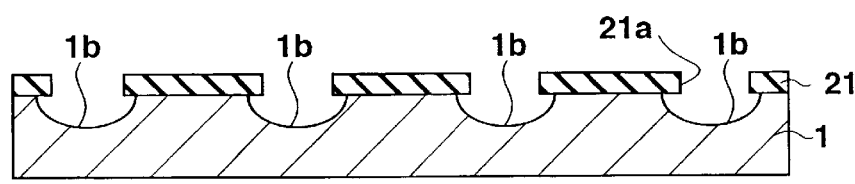
Figure 14D:
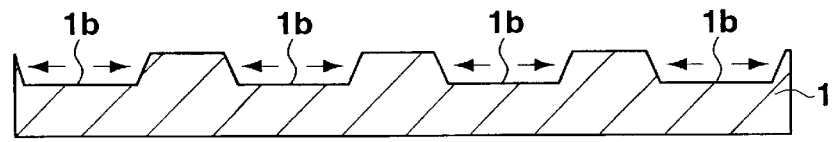

Subsequently, as shown in FIG. 14C, the surface of the substrate 1 is selectively etched by plasma etching that uses, for instance, sulfur hexafluoride ($SF_6$), by using the position control film 21 as a mask. The etching conditions may be set such that the output power is 22.5 W, the pressure is 160 mTorr, and the etching time is one minute. As a result, the surface of the substrate 1 is formed with a plurality of recesses 1b periodically, for instance, so that they correspond to the respective openings 21a of the position control film 21 (recesses forming step). For example, a plurality of circular recesses 1b having the same size are formed at regular intervals in both longitudinal and lateral directions.

After the formation of the recesses 1b, the position control film 21 is removed by etching it by using, for instance, an etching liquid containing hydrogen fluoride. Then, the surface of the substrate 1 is etched at 80° C. by using, for instance, an etching liquid containing potassium hydroxide (KOH). As a result, as indicated by arrows in FIG. 14D, the etching proceed selectively at the side faces of the respective recesses 1b. This is because the etching rate of a silicon single crystal depends on the lattice surface; the etching rate of the (111) surface is very low while the (−100) surface, the (00−1) surface, and the (0−10) surfaces that correspond to the side faces of the recesses 1b is relatively high. Although a negative one of indices of the respective directions for expressing a lattice surface is usually overlined, here it is indicated by an advanced minus sign for convenience.

Figure 14E:
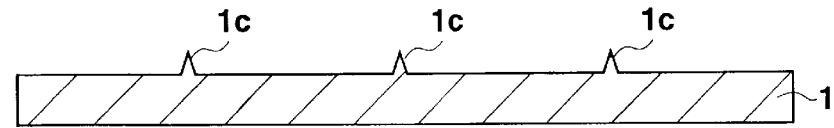

Therefore, as the etching further proceeds (for example, after a lapse of 30 seconds), a plurality of protrusions 1c at positions (for example, indicated by broken lines in FIG. 16) between the recesses 1b as shown in FIG. 14E. The etching is stopped at a time point when the protrusions 1c of a proper size are formed on the surface of the substrate 1 in this manner (protrusions forming step). The respective protrusions 1c will serve, in a later step, as position determining means (i.e., assisting means) that will become nuclei for formation of wires 2 and determine their positions. In this manufacturing method, the size and the positions of the openings 21a that are formed in the position control film forming step are adjusted so that the protrusions 1c are formed so as to correspond to the forming positions of the respective wires 2. The above-described steps from the position control film forming step to the protrusions forming step belong to a position determining means forming step (i.e., assisting means forming step). Incidentally, in this manufacturing method, since an formation assisting film forming step is executed after the position determining means forming step as described later, the assisting means forming step includes the position determining means forming step and the formation assisting film forming step.

Figure 15A:
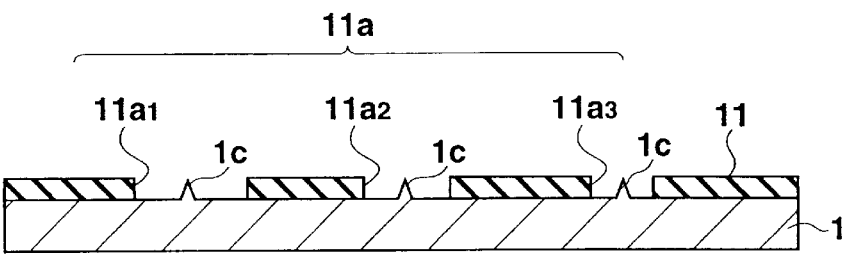
FIGS. 15A–15C are sectional views showing respective steps following the step of FIG. 14E.

After the formation of the protrusions 1c, as shown in FIG. 15A, a silicon dioxide film of about 25 nm in thickness as a formation assisting film 11 is formed on the substrate 1 by CVD (chemical vapor deposition), for instance. Thereafter, a plurality of holes 11a are formed so as to correspond to the respective protrusions 1c by selectively etching the formation assisting film 11 in the same manner as in the formation assisting film forming step in the previous manufacturing method. For example, in the case of forming the device shown in FIG. 10, holes $11a_1$, having a diameter of about 1 μm, holes $11a_2$ having a diameter of about 0.8 μm, and holes $11a_3$ having a diameter of about 0.6 μm are formed for the respective columns in the same manner as in the previous manufacturing method. As a result, the formation assisting film 11 as an assisting means is formed (formation assisting film forming step, assisting means forming step). In this step, it is not necessary that the protrusions 1c be located at the centers of the respective holes 11c; it suffices that the protrusions 1c be exposed on the surface so as to be in one-to-one correspondence with the respective holes 11a.

Figure 15B:
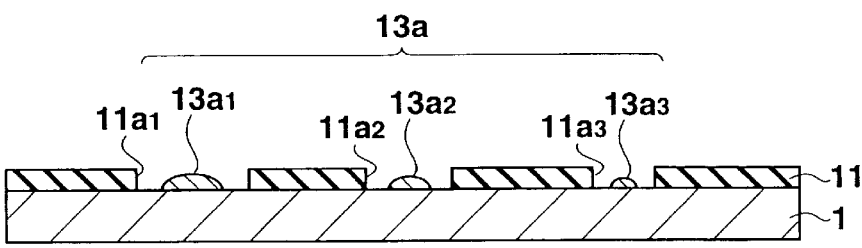

After the formation of the formation assisting film 11, the portions of the substrate 1 that are exposed through the respective holes 11a of the formation assisting film 11 are cleaned and dried and respective catalyst layers 13 are formed on the exposed portions of the substrate 1 by evaporating a metal to serve as a catalyst during growth of the wires 2 in the same manner as in the previous manufacturing step (evaporation step). The same heating step as in the previous manufacturing method is executed approximately at the same time as the evaporation step or when necessary. As a result, as shown in FIG. 15B, the catalyst layers 13 locally melt silicon and cohere with the respective protrusions 1c serving as nuclei on the portions of the substrate 1 that are exposed through the respective holes 11a of the formation assisting film 11, and a plurality of melted alloy droplets 13a are formed at the positions of the respective protrusions 1c. At this time, the sizes of the melted alloy droplets 13a are controlled by the respective holes 11a of the formation assisting film 11. At this time, even if the positions of the protrusions 1c are deviated from the centers of the respective holes 11a, the melted alloy droplets 13a can reliably be formed at the positions of the respective protrusions 11c because the melted alloy droplets 13a cohere with the respective protrusions 1c serving as nuclei.

Figure 15C:
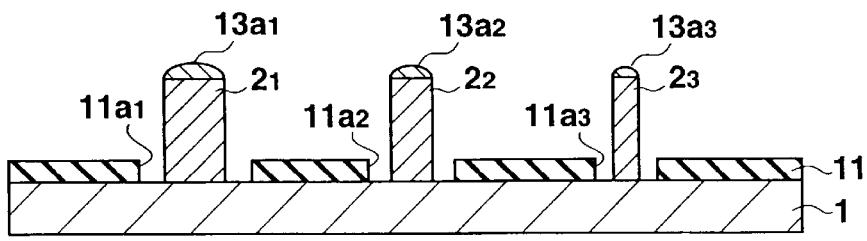

After the formation of the melted alloy droplets 13a, as shown in FIG. 15C, wires 2 are grown selectively under the melted alloy droplets in the same manner as in the previous manufacturing method (wire growing step). That is, the wires 2 grow at the positions of the respective protrusions 1c. Thus, the device shown in FIG. 10 is formed.

If necessary, an oxidation step may be executed after the growth of the wires 2 in the same manner as in the previous manufacturing method.

Figure 17:
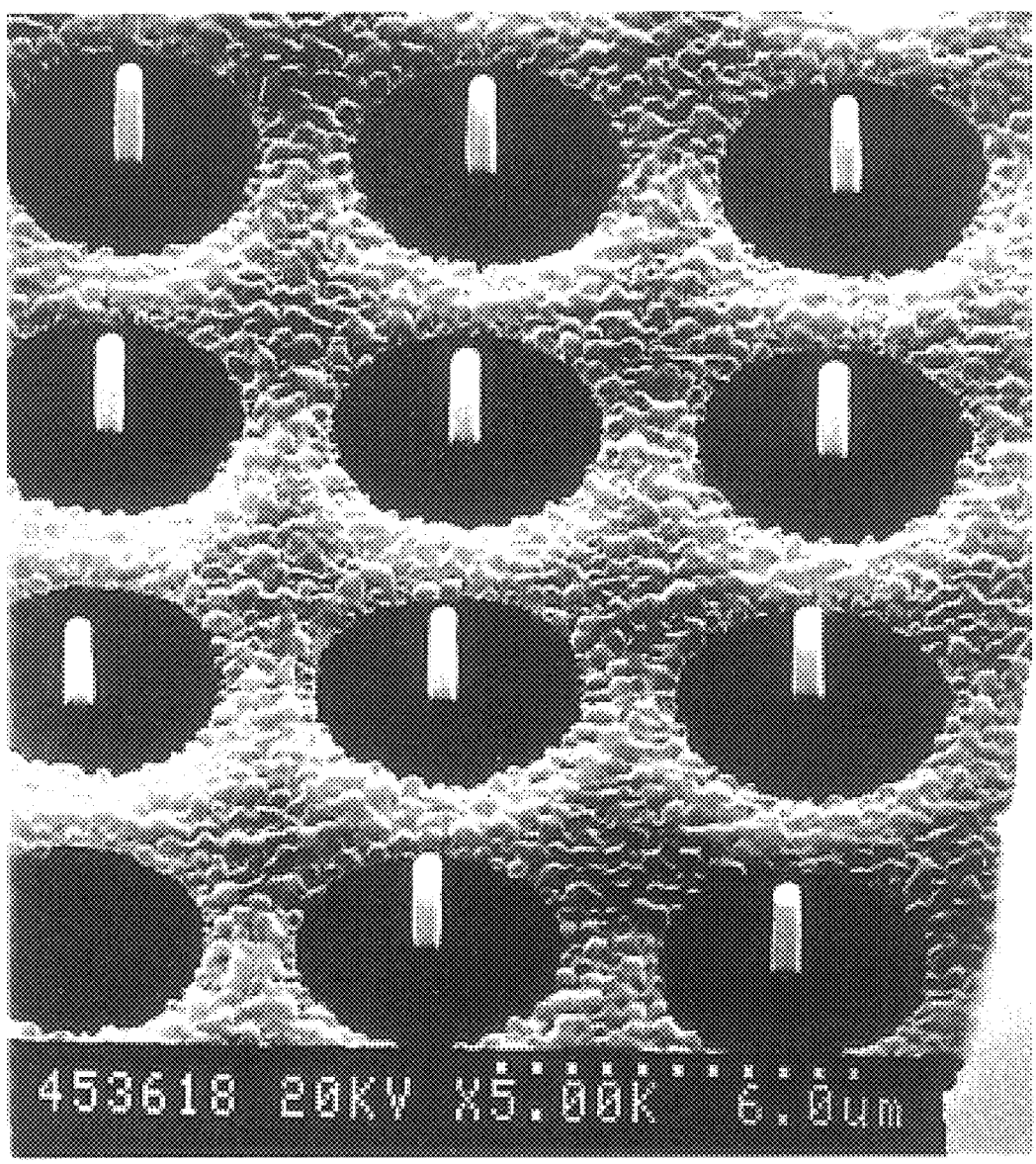
FIG. 17 is a SEM photograph showing states of respective wires of a device manufactured by the manufacturing method shown in FIGS. 14A–14E and 15A–15C.

FIG. 17 is a SEM photograph of a device formed by this manufacturing method. Incidentally, the device of FIG. 17 was formed such that the openings 21a of the position control film 21 were formed as circles of the same size at regular intervals in both longitudinal and lateral directions and that the holes 11a of the formation assisting film 11 were formed also as circles of the same size. As seen from the figure, the wires 2 were grown, one for each hole 11a, approximately at the same positions in the respective holes 11a of the formation assisting film 11 and their thicknesses were uniform. Incidentally, a comparison with a device formed by the previous manufacturing method shows that this manufacturing method can control even the positions of the wires 2 in the respective holes 11a of the formation assisting film 11 and hence provides a more accurate control.

In this manufacturing method of a device having wires, since the protrusions 1c as the position determining means are formed on the substrate 1, the melted alloy droplets 13a can be formed at the positions of the respective protrusions 1c by causing the catalyst layers 13 to cohere with the respective protrusions 1c serving as nuclei. That is, the respective wires 2 can be formed at designed forming positions with high accuracy.

Further, since a metal as a catalyst is evaporated through the formation assisting film 11 after the formation of the protrusions 1c, the thicknesses of the wires 2 can be controlled in accordance the sizes of the respective holes 11a of the formation assisting film 11. Thus, the respective wires 2 can be formed at designed thicknesses with high accuracy.

The invention is not limited to the above-described third embodiment and various modifications are possible. For example, although in the embodiment the wires 2 are arranged at regular intervals in both longitudinal and lateral directions, the invention encompasses a case where the wires 2 are arranged at given pitches in accordance with the use of the device. Even in this case, the device can be manufactured in the sa me manner as in the embodiment.

Although in the embodiment the formation assisting film 11 is formed with silicon dioxide, it may be formed with other substances such as silicon nitride ($SiN_4$) and proper resins as long as they do not form melted alloy droplets with the metal that is evaporated in the evaporation step.

Although in the embodiment the position control film 21 is formed with silicon dioxide, it may be formed with other substances such as a proper resin.

Although in the above embodiment the protrusions 1c as the position determining means are formed on the surface of the substrate 1, the position determining means may be any means as long as they can serve as nuclei so that the melted alloy droplets 13a cohere at intended positions as well as can serve as nuclei during the formation of the wires 2. For example, they may be minute grooves, or recesses each having one particular deepest position. However, the protrusions 1c as described in the embodiment that are formed by etching the surface of the substrate 1 are preferable because they serve as nuclei during the cohesion of the melted alloy droplets 13a as well as nuclei during the epitaxial growth of the wires 2.

Further, although in the embodiment a silane gas in directly introduced into the reaction furnace (not shown) in the wire growing step, it may be introduced into the reaction furnace after being diluted with an inert gas such as a helium (He) gas or an argon (Ar) gas.

In addition, although in the embodiment a silane gas is used as the silicon material gas, a disilane ($Si_2H_6$) gas or a trisilane ($Si_3H_8$) gas, or even a mixed gas of at least two of a silane gas, a disilane gas, and a trisilane gas may be used instead of a silane gas. Even with such a gas other than a silane gas, silicon wires having sufficiently small diameters and good shapes can be grown under the same conditions as with a silane gas.

Further, not only a silane gas, a disilane gas, and a trisilane gas but also gases capable of producing silicon by a decomposition reaction, such as a silicon chloride ($SiCl_4$) gas that is diluted with a hydrogen gas ($H_2$), may be used as the silicon material gas. In the latter case, the gas pressure and the heating temperature are determined properly for the kind of gas used.

In addition, although the embodiment is directed to the case of growing the silicon wires 2 on the silicon substrate 1, the invention is widely applicable to devices in which wires are grown on a substrate by the VLS method.

Still further, although the embodiment is directed to the case where the device according to the invention is used as a light-emitting device or an array device in which wiring is made in matrix form, it may be used as needles of an AFM (atomic force microscope) or an electron emission device.

As described above, in one device having wires according to the invention, since the forming positions of the respective wires are controlled, the respective wires can be arranged at positions that are designed for an intended purpose, resulting in an advantage that the device can be put into practical use. For example, a matrix-like array device can be obtained in which wires are arranged periodically.

Further, in another device having wires according to the invention, since the thicknesses of the respective wires are controlled, there is obtained an advantage that the thicknesses of the respective wires can be adjusted arbitrarily in accordance with an intended purpose. Therefore, there can be obtained a device in which the thicknesses of the respective wires are equalized and a device in which wires of different thicknesses are arranged to emit visible light beams of a plurality of wavelengths.

Still further, in the manufacturing method of a device having wires according to the invention, since the assisting means for assisting the formation of wires on a substrate are formed, the forming positions and the thicknesses of respective wires can be controlled by utilizing the assisting means. This results in an advantage that the wires can be grown with high accuracy. Thus, the device having wires according to the invention can be realized.

What is claimed is:

1. A manufacturing method of a quantum wire, comprising the steps of:

evaporating, on a silicon substrate, a metal that forms a melted alloy droplet with silicon; and growing, after the evaporating step, a silicon quantum wire by heating the silicon substrate to 400° C. or less in an atmosphere containing, at 0.5 Torr or more, a silicon material gas that produces silicon by a decomposition reaction thereof and can have a negative variation in Gibbs free energy in the decomposition reaction at 400° C. or less.

2. The manufacturing method according to claim 1, wherein the metal is at least one of gold, silver, and indium.

3. The manufacturing method according to claim 1, wherein the metal is evaporated at a thickness of 5 nm or less in the evaporating step.

4. The manufacturing method according to claim 1, wherein the silicon material gas is at least one of a silane gas, a disilane gas, and a trisilane gas.

* * * * *